United States Patent [19]

Tachimori et al.

[11] Patent Number: 5,189,508
[45] Date of Patent: Feb. 23, 1993

[54] SILICON WAFER EXCELLING IN GETTERING ABILITY AND METHOD FOR PRODUCTION THEREOF

[75] Inventors: Masaharu Tachimori; Kazunori Ishizaka; Hideo Araki, all of Hikari, Japan

[73] Assignees: Nippon Steel Corporation; NSC Electron Corp., both of Tokyo, Japan

[21] Appl. No.: 784,628

[22] Filed: Oct. 31, 1991

Related U.S. Application Data

[63] Continuation of Ser. No. 334,883, Mar. 30, 1989, abandoned.

[30] Foreign Application Priority Data

Mar. 30, 1988 [JP] Japan .................................. 63-78370

[51] Int. Cl.$^5$ ..................... H01L 23/36; H01L 29/04; H01L 21/306
[52] U.S. Cl. .......................................... 257/49; 437/12; 257/635; 257/913
[58] Field of Search ..................... 357/78, 59 R, 59; 437/12

[56] References Cited

U.S. PATENT DOCUMENTS

| | | | |
|---|---|---|---|
| 4,053,335 | 10/1977 | Hu | 148/74 |
| 4,187,514 | 2/1980 | Tomisawa et al. | 357/22 |
| 4,279,671 | 7/1981 | Komatsu | 148/188 |
| 4,375,125 | 3/1983 | Byatt | 29/588 |
| 4,608,096 | 8/1986 | Hill | 148/33 |
| 4,631,804 | 12/1986 | Roy | 29/576 |
| 4,675,715 | 6/1987 | Lepselter | 357/59 |
| 4,828,629 | 5/1989 | Ikeda et al. | 148/33.3 |

FOREIGN PATENT DOCUMENTS

| | | | |
|---|---|---|---|
| 0067969 | 6/1977 | Japan | 437/12 |
| 0002657 | 1/1979 | Japan | 437/12 |
| 0007882 | 1/1979 | Japan | 437/12 |
| 0090960 | 6/1982 | Japan | 437/12 |
| 0162444 | 10/1982 | Japan | 437/12 |
| 0035932 | 3/1983 | Japan | 437/12 |
| 0089840 | 5/1983 | Japan | 437/12 |
| 58-134430 | 8/1983 | Japan | 21/31 |
| 138035 | 8/1983 | Japan | 357/78 |
| 0016532 | 1/1986 | Japan | 437/12 |
| 61-135128 | 6/1986 | Japan | 21/322 |
| 0135128 | 6/1986 | Japan | 437/12 |
| 61-154132 | 7/1986 | Japan | 21/316 |
| 0159741 | 7/1986 | Japan | 437/12 |
| 63-222435 | 9/1988 | Japan | 21/322 |

*Primary Examiner*—Andrew J. James
*Assistant Examiner*—Stephen D. Meier
*Attorney, Agent, or Firm*—Wenderoth, Lind & Ponack

[57] ABSTRACT

A silicon wafer comprising a substrate of single crystal silicon, a silicon oxide film 1 to 8 Å in thickness formed on one surface of said substrate, and a polysilicon layer formed on said silicon oxide film and possessing an excellent gettering ability, is prepared by oxidizing single crystal silicon, thereby forming a silicon oxide film 1 to 8 Å in thickness on said surface, and exposing said silicon oxide film to a gaseous silane at an elevated temperature, thereby forming a polysilicon layer on said silicon oxide film.

6 Claims, No Drawings

SILICON WAFER EXCELLING IN GETTERING ABILITY AND METHOD FOR PRODUCTION THEREOF

This application is a continuation of now abandoned application Ser. No. 07/334,883 filed Mar. 30, 1989.

BACKGROUND OF THE INVENTION

1. Field of the Invention

This invention relates to a silicon wafer possessing an excellent gettering ability and a method for the production thereof. More particularly, it relates to a silicon wafer of excellent gettering ability for use in electronic devices such as integrated circuits and a method for the production thereof.

2. Description of the Prior Art

In the production of integrated circuit devices on silicon wafers, when defects, defiling substances, or impurities are present in or are introduced into the surface part of silicon wafers on which the devices are formed, they induce the phenomenon of immoderate current leakage and seriously affect the yield of acceptable devices from the production line. These harmful defects, defiling substances, and impurities can be relocated to a certain extent from device-forming regions to harmless regions in substratal material. This fact has found recognition in the technical field. In the technical field of the electronics industry, the method and process for dispersing and trapping such defects, defiling substances, and impurities occurring, in active device regions prior to and during the formation of devices are referred to as "gettering.".

The method which, for the impartation of a gettering ability to a silicon wafer, comprises subjecting silane gas to thermal decomposition in the presence of the silicon wafer, thereby causing the vapor-phase growth of a polycrystalline silicon layer on the rear surface of the silicon wafer, has been known to the art [Japanese Patent Laid-Opens SHO 58(1983)-138,035, SHO 59(1984)-186,331, and SHO 52(1977)-120,777].

Incidentally, the gettering with the polycrystalline silicon layer is accomplished by the fact that the impurities present in the crystal silicon wafer are trapped in the grain boundaries of polycrystalline silicon. For the enhancement of the gettering ability, it is necessary that the polysilicon layer should be formed in intimate contact with the substrate of single crystal silicon and, moreover, the polysilicon layer should possess a large grain boundary surface area. For the grain boundary surface area to be amply large, the individual crystal grains are desired to be small and uniform.

In the case of the silicon wafer disclosed in Japanese patent Laid-Open- SHO 52(1977)-120,777, it is demonstrated in Example 1 that when one lateral half of the oxide film 2,700 Å in thickness formed on the rear side of the silicon wafer was etched off, a 1.6 microns poly silicon film was superposed on the rear surface of the silicon wafer, and the silicon wafer thus treated was evaluated for the effectiveness of the gettering process due to the decrease in leak currents of MOS capacitors, the leak current on the side having the oxide film etched off was decreased approximately by two orders of magnitude. Example 1 clearly purports to express that the absence of an oxide film between the silicon substrate and the polysilicon film is an essential requirement for the impartation of the gettering effectiveness.

We have repeated the example as follows. A sample silicon wafer was immersed in 1% hydrofluoric acid to etch off the oxide film on the surface of silicon wafer and expose the underlying surfaces of single crystal silicon. For the wafer to be prevented from growing an oxide film on the surface thereof, it was placed in a low pressure chemical vapor deposition (LPCVD) oven swept in advance at room temperature with nitrogen gas passed at a flow rate of 20 liters/min. Then, the interior of the oven holding the wafer was vacuumized to 40 Pa and heated from room temperature to 650° C. under continued flow of nitrogen gas supplied at a rate of 0.5 liter/min. When the temperature reached 650° C., silane gas was supplied to the oven at a rate of 0.35 liter/min as carried by a flow of nitrogen gas fed at a rate of 0.5 liter/min for 120 minutes to deposit a polysilicon film on the surface of the silicon wafer. After the treatment of deposition, the surface of the silicon wafer was examined under an optical microscope and a scanning electron microscope. This examination revealed that absolutely no or only partial growth of polysilicon film occurred on the surface of the silicon wafer. On closer examination of the surface suffering from partial growth of the polysilicon film, it was found that particles produced within the vacuumized oven were adhering to the affected part or a polysilicon film was growing on the part to which particles in the liquid adhered when the oxide film was etched off with hydrofluoric acid. This observation may be logically explained by a postulate that on the surface of a silicon wafer from which an oxide film is etched off to expose the underlying surface of single crystal silicon, no growth of polysilicon film is allowed because the CVD reaction is epitaxial in nature, while only in the portion covered with particles, the polysilicone film grows in the form of an island.

By the method disclosed in Japanese Patent Laid-Open SHO 58(1983)-138,035, no sufficient gettering ability is obtained because the polysilicon layer is formed directly on the surface of the substrate of single crystal silicon.

By the method of Japanese Patent Laid-Open SHO 59(1984)-186,331, the polysilicon layer formed on the surface of the substrate of single crystal silicon is doped with oxygen. This doping with oxygen, however, rather impairs the gettering effectiveness to be brought about by the polysilicon layer.

An object of this invention, therefore, is to provide a silicon wafer possessing an excellent gettering ability and a method for the production thereof.

SUMMARY OF THE INVENTION

The object described above is accomplished by a silicone wafer which comprises a substrate of single crystal silicon, a silicon oxide film formed in a thickness in the range of 1 to 8 Å on one surface of the substrate, and a polysilicon layer formed on the silicon oxide film and which possesses an excellent gettering ability.

The object described above is accomplished by method for the production of a silicon wafer possessing an excellent gettering ability, comprises exposing the surface of a substrate of single crystal silicon to a molecular oxygen-containing gas, thereby forming a silicon oxide film 1 to 8 Å in thickness on the surface, and exposing the silicon oxide film to a gaseous silane at an elevated temperature, thereby forming a polysilicon layer on the silicon oxide film.

In accordance with this invention, since the polysilicon layer is formed on the substrate of single crystal silicon through the medium of the silicon oxide film possessing a specified thickness, the polysilicon layer excels in adhesiveness and homogeneity and the individual crystal grains of the polysilicon layer are small and uniform in size. As compared with the conventional silicon wafer formed solely of a polysilicon layer, the silicon wafer of this invention exhibits a highly desirable gettering ability because the grain boundary surface area is large. This silicon wafer, therefore, can be used as a material which permits production of high-density IC devices in high yields.

EXPLANATION OF PREFERRED EMBODIMENT

The silicon wafer produced by this invention with an excellent gettering ability comprises a substrate of single crystal silicon, a silicon oxide film formed in a thickness in the range of 1 to 8 Å on one surface of the substrate, and a polysilicon layer formed on the silicon oxide film.

The substrate of single crystal silicon to be used in the present invention is produced by lapping the surface of a substrate of single crystal silicon and then subjecting the lapped surface to a chemical etching treatment thereby removing therefrom a surface layer not more than some tens of microns in thickness and imparting an abraded surface thereto. This substrate has a thickness in the range of 200 to 2,000 microns, preferably 300 to 1,000 microns.

The silicon oxide film formed on the surface of the substrate of single crystal silicon has a thickness in the range of 1 to 8 Å, preferably 1 to 5 Å. So long as, the silicon oxide film formed on the surface of the substrate of single crystal silicon has a thickness of at least 1 Å, the polysilicon layer to be superposed on the silicon oxide film is formed with uniform and high adhesiveness thoughout the entire surface of the substrate of single crystal silicon. If the thickness of the silicon oxide thereon is less than 1 Å, the polysilicon layer is formed unevenly with inferior adhesiveness and the polysilicon grains are unduly large. Conversely, if the thickness of the silicon oxide film exceeds 8 Å, the gettering ability is impaired because the silicon oxide film interferes with the migration of impurities from the substrate of single crystal silicon into the polysilicon layer. Thus, the thickness of the silicon oxide film is desired to be in the range of 1 to 8 Å.

For the silicon oxide film to be effectively formed on the surface of the substrate of single crystal silicon, the substrate of single crystal silicon is treated with dilute hydrofluoric acid for removal of oxides and staining substances adhering to the surface thereof, then rinsed with deionized water, and further dried. Subsequently, the substrate of single crystal silicon is heated in an atmosphere of molecular oxygen-containing gas or steam to form thereon the silicon oxide film. The molecular oxygen-containing gases usable for this purpose include pure oxygen gas, a mixture of oxygen gas with an inert gas, air, and oxygen-enriched air, for example. This formation of the silicon oxide film may be otherwise attained by treating the substrate of single crystal silicon in oxygen plasma. Alternatively, it may be accomplished by immersing the substrate of monosilicon in an oxidizing chemical agent or subjecting the substrate to anodic oxidation. The oxidizing chemical agents usable effectively for this purpose include nitric acid, dichromates or salts thereof, permanganates or salts thereof, perchlorite or salts thereof, and aqueous hydrogen peroxide solution, for example. The thickness of the silicon oxide film hinges on the conditions of the oxidation involved. When the silicon oxide film is formed by heating the substrate of single crystal silicon in the air under the pressure of one atmosphere, for example, the growth rate of the oxide film and the temperature of the substrate of single crystal silicon have the following relation.

| Temperature of substrate (°C.) | 300 | 400 | 500 | 600 | 700 |
|---|---|---|---|---|---|
| Growth rate of oxide film (Å/min) | 0.1 | 0.14 | 0.22 | 0.33 | 0.46 |

To effect the formation of the oxide film in the air, therefore, the substrate is heated at a temperature in the range of 300° to 700° C., preferably 300° to 500° C., for a period in the range of 2 to 100 minutes, preferably 2 to 50 minutes.

The thickness of the silicon oxide film as reported in this invention represents a magnitude measured with an ellipsometer. This measurement is made immediately after the treatment of the substrate of single crystal silicon for oxidation, namely before the formation of the polysilicon layer. In this case, the zero point fixed as described below is subtracted from the scale reading of the ellipsometer. The substrate of single crystal silicon is immersed in an aqueous 1% hydrofluoric acid solution for removal of a natural oxide film from the surface thereof, then rinsed in a deionized water, spin dried, and immediately subjected to measurement with an ellipsometer. The numerical value obtained by this measurement is taken as zero point. The oxide film is assumed to possess a refractive index of 1.460.

The polysilicon layer is formed on the silicon oxide film. The thickness of the polysilicon layer is in the range of 1,000 Å to 5 μm, preferably 5,000 Å to 1.5 μm. The crystalline grains of this layer have diameters not exceeding 2 microns and preferably falling in the range of 0.05 to 0.5 micron.

The formation of the polysilicon layer on the silicon oxide film is accomplished by heating the substrate of single crystal silicon in an atmosphere of a gaseous silane diluted with nitrogen gas or argon gas, for example at a temperature in the range of 570° to 800° C., preferably 580° to 700° C., for a period in the range of 0.1 to 7 hours, preferably 0.3 to 2 hours under a vacuum or atmospheric pressure. The treatment of this nature may be performed by low pressure CVD method. The silanes which are usable in this invention include monosilane ($SiH_4$), dichlorosilane ($SiH_2Cl_2$), and monochlorosilane ($SiH_3Cl$), for exmple.

In the silicon wafer produced by the present invention, the polysilicon layer is formed in uniform thickness with outstanding adhesiveness because the silicon oxide film possessing a specific thickness is formed on the surface of the substrate of single crystal silicon. The silicon oxide film offers countless nuclei necessary for the growth of the polycrystalline silicon layer. In the absence of the silicon oxide film, since the polysilicon layer grows in the form of islands with defiling particles as nuclei, the growth rate generally defies definition, the growth in the form of islands proceeding at a rate of some tens of Å/min. and otherwise at substantially negligible (not measurable) rate. In the presence of the silicon oxide film, the polysilicon layer grows at a high rate of 150 Å/min. In the polysilicon layer growing in the form of islands because of the absence of the silicon oxide film, the crystalline grain size is in the range of 3 to 10 microns. In the polysilicon layer of the silicon wafer of this invention, the crystalline grains are uniform and so small as to fall approximately in the range of 0.1 to 0.4 micron (determined by the cross-section TEM observation). Even when slight contamination is present on the surface of the substrate of single crystal silicon, the mark of this contamination is no longer visible after the formation of the polysilicon layer, because of the oxide film providing countless nuclei for the growth of polycrystallines.

When the silicon wafer of this invention is used for the producion of an IC device, for example, the heat treatment to be performed at a temperature exceeding 900° C. at the outset of the process causes the silicon oxide film to agglomerate and transform into many particles of oxide and eventually cease to exist, and allows the substrate of single crystal silicon and the polysilicon layer to come into direct contact with each other.

In the present invention, the gettering ability is determined as follows.

A silicon wafer is prepared by forming a silicon oxide film on one surface of a substrate of single crystal silicon, superposing a polysilicon layer of the film, and polishing the remaining surface of the substrate into a specular surface. MOS capacitors are produced by exposing the specular surface to pure oxygen gas heated to 1,000° C. thereby forming on the specular surface an oxide film about 300 Å in thickness and then forming on the oxide film disk-shaped aluminum electrodes 1 mm in diameter and 5,000 Å in thickness by vacuum deposition. Then, the MOS capacitors are tested for the generation life time of minority carrier therein. The gettering ability of the silicon wafer is evaluated on the scale of this generation life time. For information on the measurement of the generation life time of the minority carrier, reference is made to "MOS Physics and Technology" (John Wiley & Sons) written by E. H. Nicollian and J. R. Brewws. The generation life time of the minority carrier is reduced when the silicon substrate is contaminated with a metallic impurity. The generation life time is improved and lengthened when the metallic impurity is gettered. Generally, while the MOS capacitors are undergoing the treatment for oxidation in the process of manufacture, the site of the treatment cannot be completely prevented from spontaneous contamination of a barely traceable amount of metallic impurities from the ambient air. When a plurality of silicon substrates different in gettering ability are simultaneously treated, therefore, they show proportionate differernces in the generation life time of the minority carrier and permit relative comparison of their gettering ability.

Now, the present invention will be described more specifically below with reference to working examples.

EXAMPLES 1 to 4

A substrate of single crystal silicon 600 microns in thickness was immersed in an aqueous 1% hydrofluoric acid solution for removal of natural oxide film adhering to the surface thereof, then rinsed in deionized water, and further dried with a spin drier. At the end of the drying treatment, the single crystal silicon substrate was immediately placed in an electric oven filled with air at 400° C. and left standing therein for a varying period of 7, 22, 36, or 43 minutes to form thereon a silicon oxide film of a varying thickness of 1 Å, 3 Å, 5 Å, or 6 Å. Subsequently, the substrate was treated by the LPCVD method using thermal decomposition of silane ($SiH_4$) gas carried in nitrogen gas at 650° C., to form a polysilicon layer about 1 micron in thickness on the silicon oxide film.

The wafer consequently obtained had a polycrystalline silicon layer and a silicon oxide film on each of the surfaces thereof. One surface of this wafer was abraded to remove the polycrystalline silicon layer and the underlying silicon oxide film and expose the substrate of single crystal silicon. The abraded surface was further polished to be given a specular finish. On the specular surface of the wafer thus produced, MOS capacitor of the description given above was fabricated and tested for the life time of the minority carrier. The gettering ability of the silicon wafer was evaluated based on the life time. The results were as shown in Table 1.

The observation of the silicon wafer under an optical microscope and a scanning electron microscope revealed that the growth rate of the polycrystalline silicon layer was 150 Å/min. and the diameters of the crystal grains were in the range of 0.1 to 0.4 microns. When this silicon wafer was placed in a dark room and observed under a light beam, absolutely no white pattern which was caused by a partial growth of the polycrystalline silicon layer was detected.

Control 1

A silicon wafer was obtained by following the procedure of Example 1, except that the formation of a silicon oxide film on the surface of the substrate of single crystal silicon was omitted. The silicon wafer having a polysilicon layer formed on the surface of the substrate of single crystal silicon was tested for gettering ability by the procedure of Examples 1 to 4. The results are shown in Table 1.

When this silicon wafer was observed under an optical microscope and a scanning electron microscope, it was found that the polysilicon layer grew in the form of islands at a rate of some tens of Å/min. and attained virtually no growth elsewhere. The growth rate could not be generally defined because the polysilicon layer grew with defiling particles as nuclei. Where this layer grew in the form of islands, the crystalline grains had diameters in the range of 3 to 10 microns. When this silicon wafer was placed in a dark room and observed under a light beam, it showed white patterns resembling stars, islands, or streaks of liquid. The stars were those of the polysilicon layer growing around particles generated in the LPCVD oven, the islands were either aggregates of the stars mentioned above or those of the polysilicon layer growing around points of contact between the silicon wafer and a boat (a quartz jig for mounting the wafer), and the streaks of liquid were those of polysilicon layer growing around particles remaining on the wafer surface after the wafer had been etched for removal of the oxide adhering to the wafer, rinsed with deionized water, and lifted from the rinsing bath. White patterns of one sort or other were found on 95 to 100 sample silicon wafers treated in the LPCVD oven in the manner described above. No deposition of polysilicon layer was detected on the sample silicon wafers which showed no white pattern.

Control 2

A silicon wafer was obtained by following the procedure of Examples 1 to 4, except that the thickness of the silicon oxide film was changed to 10 Å. This silicon wafer was tested for gettering ability in the same manner. The results were as shown in Table 1.

TABLE 1

| No. | Thickness of silicon oxide film (Å) | Generation life time (ms) | |
|---|---|---|---|
| Control 1 | 0 | 1.0 | 1.4 |
| Example 1 | 1 | 3.0 | 8.5 |
| Example 2 | 3 | 3.3 | 6.7 |
| Example 3 | 5 | 2.6 | 5.2 |
| Example 4 | 6 | 1.8 | 3.7 |
| Control 2 | 10 | 1.2 | 1.6 |

It is clearly noted from Table 1 that the silicon wafers according to this invention (Examples 1 to 4) possessed longer values of generation life time of minority carrier than the conventional countertype (Control 1). Further in the silicon wafer of Control 1 which had no silicon oxide film formed in advance thereon, portions allowing the growth of polysilicon grains and portions not allowing the growth occurred on the substrate of single crystal silicon and the crystalline grains had diameters averaging not less than 3 microns and partially exceeding 10 microns. In contrast, in the case of the silicon wafers of Examples 1 to 4 incorporating therein silicon oxide films exceeding 1 Å, polycrystalline silicon grains grew throughout the entire surface of the substrates of single crystal silicon. These crystalline grains were uniform and possessed diameters in the range of 0.1 to 0.4 micron.

REFERENTIAL EXAMPLE

The silicon wafer produced in Example 1 as provided with a silicon oxide film 5Å in thickness and a polysilicon layer 1 micron in thickness was oxidized in an atmosphere of steam at 900° C. for two hours. It was then observed in section under a transmission electron microscope and, at the same time, analyzed for chemical composition. No continuous oxide film was detected but the occurrence of oxide in the form of scattered rice grains was found in the boundary between the substrate of single crystal silicon and the polysilicon layer. In the greater part of the boundary, the substrate of single crystal silicon and the polysilicon layer adhered intimately to each other and part of the polysilicon layer underwent solid-phase epitaxial growth.

In the process of IC production, for doping an appropriate element into well regions in the silicon wafer or, for locally oxidizing the silicon wafer in order to insulate one device region from others, a nitride film is used as a mask. Generally, it is beneath this nitride film that an oxide film is formed. In this case, this oxide film is called a pad oxide film. In the process of the IC production, the step for the formation of this pad oxide film is frequently almost at the beginning of the process. Typically the pad oxidation is carried out in an atmosphere of dry oxygen at 1,000° C. for one hour or in an atmosphere of steam at 900° C. for two hours. Under these conditions, there is formed a pad oxide film approximately 500 Å in thickness. As demostrated herein, when the silicon wafer of this invention is exposed to the conditions involved in the step for the formtion of the pad oxide film mentioned above, the oxide film 1 to 8Å in thickness interposed between the substrate of single crystal silicon and the polysilicon layer ceases to exist and the substrate and the polysilicon layer come into intimate contact with each other.

What is claimed is:

1. A silicon wafer possessing an excellent ability of gettering impurities from a single crystal silicon semiconductor, comprising:
   a substrate of single crystal silicon for forming devices therein;
   a silicon oxide film 1 to 8 Å in thickness, formed on one surface of said substrate, providing countless nuclei necessary for uniform growth of a polycrystalline film; and
   a polysilicon film formed on said silicon oxide film as a getter of impurities in said substrate.

2. A silicon wafer according to claim 1, wherein said silicon oxide film has a thickness in the range of 1 to 5 Å.

3. A silicon wafer according to claim 2, wherein said polysilicon film has a thickness in the range of 5,000 Å to 1.5μm.

4. A silicon wafer according to claim 1, wherein said polysilicon film has a thickness in the range of 1,000 Å to 5 μm.

5. A silicon wafer according to claim 1, wherein said polysilicon film has crystalline grains with a diameter of 0.1 to 0.4 micron.

6. A silicon wafer according to claim 1, wherein said substrate has a thickness of 300 to 1,000 microns.

* * * * *